(12) United States Patent  
Miller et al.

(10) Patent No.: US 8,222,804 B2  
(45) Date of Patent: Jul. 17, 2012

(54) TILED OLED DEVICE WITH EDGE LIGHT EXTRACTION

(75) Inventors: Michael E. Miller, Honeoye Falls, NY (US); John W. Hamer, Rochester, NY (US); Ronald S. Cok, Rochester, NY (US)

(73) Assignee: Global OLED Technology, LLC., Wilmington, DE (US)

(*) Notice: Subject to any disclaimer, the term of this patent is extended or adjusted under 35 U.S.C. 154(b) by 188 days.

(21) Appl. No.: 12/271,978

(22) Filed: Nov. 17, 2008

(65) Prior Publication Data  
US 2010/0123384 A1   May 20, 2010

(51) Int. Cl.  
*H01J 1/62* (2006.01)

(52) U.S. Cl. ......... 313/498; 313/501; 313/504; 313/506

(58) Field of Classification Search ........... 313/495–512  
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | Vanslyke et al. | |
| 5,247,190 A | 9/1993 | Friend et al. | |
| 5,834,893 A | 11/1998 | Bulovic et al. | |
| 5,955,837 A | 9/1999 | Horikx et al. | |
| 6,091,195 A | 7/2000 | Forrest et al. | |
| 6,777,871 B2 | 8/2004 | Duggal et al. | |
| 6,787,796 B2 | 9/2004 | Do et al. | |
| 6,831,407 B2 | 12/2004 | Cok | |
| 2001/0026124 A1 | 10/2001 | Liu et al. | |
| 2003/0011303 A1 | 1/2003 | Matthies et al. | |
| 2004/0217702 A1 | 11/2004 | Garner et al. | |
| 2005/0018431 A1 | 1/2005 | Shiang | |
| 2005/0141242 A1* | 6/2005 | Takeuchi | 362/600 |
| 2005/0169012 A1* | 8/2005 | Takeuchi | 362/602 |
| 2007/0001927 A1 | 1/2007 | Ricks et al. | |
| 2007/0052345 A1* | 3/2007 | Wano | 313/504 |
| 2007/0069635 A1* | 3/2007 | Cok | 313/504 |

FOREIGN PATENT DOCUMENTS

| | | | |
|---|---|---|---|
| EP | 1 533 853 | | 5/2005 |
| JP | 2002049326 A | * | 2/2002 |
| JP | 2005-003989 | | 1/2005 |
| JP | 2005-003990 | | 1/2005 |
| JP | 2005003989 A | * | 1/2005 |
| JP | 2005-031195 | | 2/2005 |
| JP | 2005-353564 | | 12/2005 |

(Continued)

OTHER PUBLICATIONS

C. Tang et al., "Electroluminescence of doped organic thin films", J. Applied Physics, vol. 65, pp. 3610-3616, 1989.

(Continued)

*Primary Examiner* — Anh Mai  
*Assistant Examiner* — Elmito Breval  
(74) *Attorney, Agent, or Firm* — McKenna, Long and Aldridge, LLP.

(57) ABSTRACT

An area-emissive light-emitting diode (LED) device comprises a substrate having an internal substrate surface, an external substrate surface opposite the internal substrate surface, and a substrate edge; an array of area-emissive LED pixels formed on the internal substrate surface with an edge gap between the substrate edge and the LED pixel on the internal substrate surface nearest the substrate edge; and a light-extraction structure formed in the edge gap and at least partially exterior to the LED pixels.

19 Claims, 13 Drawing Sheets

FOREIGN PATENT DOCUMENTS

| | | |
|---|---|---|
| WO | WO 02/37568 | 5/2002 |
| WO | WO 02/37580 | 5/2002 |

OTHER PUBLICATIONS

Tsutsui et al., "Optical-Microactivity Structure", Applied Physics Letters 65, No. 15, pp. 1868-1870, 1994.

Lupton et al., "Bragg Scattering from Periodically Microstructured Light Emitting Diodes", Applied Physics Letters, vol. 77, No. 21, pp. 3340-3342, 2000.

Safonov et al., "Modification of Polymer Light Emission by Lateral Microstructure", Synthetic Metals 116, pp. 145-148, 2001.

Tang et al., Organic Electroluminescent Diodes, Appl. Phys. Lett. 51, pp. 913-915, 1987.

* cited by examiner

TILED OLED DEVICE WITH EDGE LIGHT EXTRACTION

FIELD OF THE INVENTION

The present invention relates to tiled arrays of organic light-emitting diode (OLED) devices and, more particularly, to OLED devices having light-extraction structures for hiding tile seams between devices.

BACKGROUND OF THE INVENTION

Flat-panel displays, such as liquid crystal displays, plasma displays, and light-emitting diode displays are commonly used for information presentation. However, the panel sizes of liquid crystal and light-emitting diode displays are limited by the manufacturing processes that are employed. In order to overcome this size limitation, practitioners have employed tiling strategies to make very-large-format, flat-panel displays. Such very-large-format, flat-panel displays employ multiple separate displays aligned edge-to-edge to give the appearance of a single, larger display. Referring to prior-art FIGS. 10-12, a very-large-format, flat-panel display 8 comprises a plurality of individual display tiles 10 aligned edge-to-edge in an array. Within each display tile 10, an active area 12 of display pixel elements 14 is located. The display pixel elements 14 are spatially distributed in a regular array over the display substrate 30 with an inter-pixel gap 22 that depends on the display design and manufacturing process limitations formed between the pixels 14.

However, typical flat-panel displays have perimeter elements such as electrical connectors and edge seals at the perimeter of each display tile 10 to provide connectivity to an external controller 80 (shown in FIG. 10) or to protect the materials comprising the display tile 10. Moreover, separate tiles 10 cannot be perfectly butted together. These perimeter elements and tile spacing form an edge gap 20 and usually take up more space than the inter-pixel gap 22. Hence, when multiple display tiles are butted together in an array, there is an edge seam 24 that forms a visible discontinuity between the pixels at the edges of each display tile 10. Moreover, the edge seam 24 typically has a different color and spacing and can reflect light differently than the pixels 14 or inter-pixel gap 22, making the edge seam 24 visible and objectionable to viewers. FIG. 12 illustrates a cross-section of an OLED device with a substrate 30 and cover 32.

A variety of ways have been proposed in the art to overcome the visually objectionable edge seam. In one approach, the edge seam 24 is made small enough that no interruption in the pixel layout is present. However, this is very difficult and expensive to accomplish. Another approach relies upon employing a fiber-optic faceplate to visually expand the active area 12 in each display tile 10 to match the size of the display tile 10. This approach, however, requires a bulky and expensive fiber-optic array. Yet another approach employs a transparent display tile with one display tile overlapping a second display tile at the edge to locate the pixels in the appropriate position. For example, US Publication No. 2007/0001927 describes a tiled display having overlapping display elements. However, there remain visible artifacts and achieving a completely transparent tile at the edges is difficult. Other art, for example US Patent Publication No. 2003/0011303 by Matthies et al., entitled "PROVIDING OPTICAL ELEMENTS OVER EMISSIVE DISPLAYS" discusses forming a layer over an array of display tiles 10, including an absorptive portion that covers the space between pixels neighboring abutted display tiles 10 to occlude light that is emitted through the edge of the display and made visible to the user. This approach will further increase the contrast of the edge seam 24 with respect to the active area 12 by reducing the luminance within the area of the edge seam 24.

Organic light-emitting diodes (OLEDs) are a promising technology for flat-panel displays and area illumination lamps. The technology relies upon thin-film layers of materials coated upon a substrate. However, as is well known, much of the light output from the light-emissive layer in the OLED is trapped due to the diffuse emission within these devices and internal reflections that occur at material boundaries within the display or between the front display surface and the air in the surrounding environment. Because light is emitted in all directions from the internal light-emitting layers of the OLED, some of the light is emitted at an angle that is nearly perpendicular to the front surface of the display. A portion of this light travels towards the front surface of the display and is emitted through the front surface of the display, forming useful light in a traditional OLED display. A second portion of the light is emitted nearly perpendicularly to the front surface of the device and can be either reflected or absorbed by the back of the display device. Much of this reflected light is then typically able to travel through the front surface of the display to become useful light. However, the light that is emitted in a direction that is not near enough to perpendicular to the front surface of the display is reflected at one of the material boundaries and is unable to escape the device. This light is either eventually absorbed within the device or travels the length of the device and escapes through the edge of the display and is not emitted through the front of the display and therefore does not provide useful light. In general, up to 80% of the light that is emitted by the light-emitting layer can be absorbed or emitted other than through the front of the display and is, therefore, lost.

OLED devices generally can have two formats known as small molecule devices such as disclosed in U.S. Pat. No. 4,769,292 and polymer OLED devices such as disclosed in U.S. Pat. No. 5,247,190. Either type of OLED device can include, in sequence, an anode, an organic EL element, and a cathode. The organic electro-luminescent (EL) element disposed between the anode and the cathode commonly includes an organic hole-transporting layer (HTL), an emissive layer (EL) and an organic electron-transporting layer (ETL). Holes and electrons recombine and emit light in the EL layer. Tang et at. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved, Inorganic materials and light emitters, for example quantum dots in a polycrystalline matrix are also known and suffer from the same optical difficulties.

Light is generated in an OLED device when electrons and holes that are injected from the cathode and anode, respectively, flow through the electron-transport layer and the hole-transport layer and recombine in the emissive layer. Many factors determine the efficiency of this light-generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes are recombined and result in the emission of light. It has been found, however, that one of the key factors that limit the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 13, a prior-art bottom-emitting OLED has a transparent substrate 30, a transparent first electrode 42, one or more layers 44 of organic material, one of which is light-emitting, and a reflective second electrode 46. The transparent first electrode 42, one or more layers 44 of organic material, and a reflective second electrode 46 form an OLED 40 that can be a pixel 14 under the control of active-matrix or passive-matrix elements and a controller (not shown). Light emitted from one of the organic material layers 44 can be emitted directly out of the device, through the substrate 30, as illustrated with light ray 50. Light can also be emitted and internally guided in the substrate 30 and OLED 40, as illustrated with light ray 52. Alternatively, light can be emitted and internally guided in the OLED 40, as illustrated with light ray 54. Light rays emitted toward the reflective second electrode 46 are reflected by the reflective second electrode 46 toward the substrate 30 and then follow one of the light ray paths 50, 52, or 54.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of Polymer Light Emission by Lateral Microstructure" by Safonov et al., Synthetic Metals 116, 2001, pp. 145-148, and "Bragg Scattering From Periodically Microstructured Light Emitting Diodes" by Lupton et al., Applied Physics Letters, Vol. 77, No. 21, Nov. 20, 2000, pp. 3340-3342. Brightness enhancement films having diffractive properties and surface and volume diffusers are described in International Publication No. WO 02/37568 entitled "BRIGHTNESS AND CONTRAST ENHANCEMENT OF DIRECT VIEW EMISSIVE DISPLAYS" by Chou et al., published May 10, 2002. The use of micro-cavity techniques is also known; for example, see "Sharply Directed Emission in Organic Electroluminescent Diodes With an Optical-Microcavity Structure" by Tsutsui et al, Applied Physics Letters 65, No. 15, Oct. 10, 1994, pp. 1868-1870.

Reflective structures surrounding a light-emitting area or pixel are referenced in U.S. Pat. No. 5,834,893 issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas.

Light-scattering techniques are also known. Chou (International Publication No. WO 02/37580) and Liu et al. (US Publication No. 2001/0026124) taught the use of a volume or surface scattering layer to improve light extraction. The light-scattering layer is applied next to the organic layers or on the outside surface of the glass substrate and has an optical index that matches these layers. Light emitted from the OLED device at higher-than-critical angles that would have otherwise been trapped can penetrate into the scattering layer and be scattered out of the device.

U.S. Pat. No. 6,787,796 entitled "ORGANIC ELECTROLUMINESCENT DISPLAY DEVICE AND METHOD OF MANUFACTURING THE SAME" by Do et al. issued Sep. 7, 2004, describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. US Patent Publication No. 2004/0217702 by Garner et al. and U.S. Pat. No. 6,831,407 by Cok similarly disclose the use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

Light-scattering layers used externally to an OLED device are described in US Publication No. 2005/0018431 entitled "ORGANIC ELECTROLUMINESCENT DEVICES HAVING IMPROVED LIGHT EXTRACTION" by Shiang and U.S. Pat. No. 5,955,837 entitled "ELECTROLUMINESCENT ILLUMINATION SYSTEM WITH AN ACTIVE LAYER OF A MEDIUM HAVING LIGHT-SCATTERING PROPERTIES FOR FLAT-PANEL DISPLAY DEVICES" by Horikx, et al. These disclosures describe and define in detail properties of scattering layers located on a substrate. Likewise, U.S. Pat. No. 6,777,871 entitled "ORGANIC ELECTROLUMINESCENT DEVICES WITH ENHANCED LIGHT EXTRACTION" by Duggal et al. describes the use of an output coupler comprising a composite layer having specific refractive indices and scattering properties.

However, none of the light-extraction techniques disclosed serve to reduce the size or visibility of edge seams in a tiled display system. There is a need therefore for an improved emissive device structure in a tiled display system.

SUMMARY OF THE INVENTION

In accordance with one embodiment, an area-emissive light-emitting diode (LED) device comprises:

a) a substrate having an internal substrate surface, an external substrate surface opposite the internal substrate surface, and a substrate edge;

b) an array of area-emissive LED pixels formed on the internal substrate surface with an edge gap between the substrate edge and the LED pixel on the internal substrate surface nearest the substrate edge; and c) a light-extraction structure formed in the edge gap and at least partially exterior to the LED pixels.

ADVANTAGES

The present invention has the advantage that it reduces the visibility of edge seams in a tiled, emissive display system by directing light from the edge seam.

It will be understood that the figures are not to scale since the individual layers are too thin and the thickness differences of various layers too great to permit depiction to scale.

DETAILED DESCRIPTION OF THE INVENTION

Figure 1:
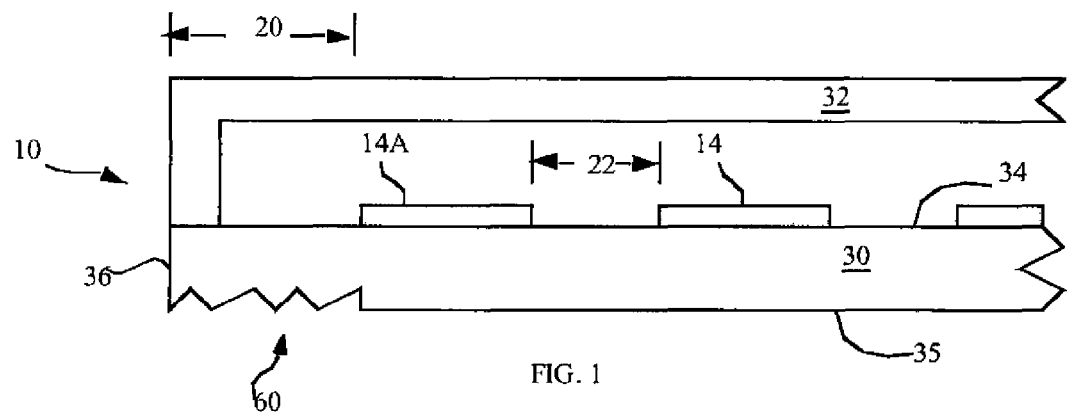
FIG. 1 is a cross-section of an LED device having edge-gap light-extraction according to one embodiment of the present invention.

Referring to FIG. 1, in accordance with one embodiment of the present invention, an area-emissive light-emitting diode (LED) device 10 comprises a substrate 30 having an internal substrate surface 34, an external substrate surface 35 opposite the internal substrate surface 34, and a substrate edge 36. An array of area-emissive LED pixels 14 is formed on the internal substrate surface 34 with an edge gap 20 between the substrate edge 36 and the LED pixel 14A on the internal substrate surface 34 nearest the substrate edge 36. The pixels 14, 14A are separated by an inter-pixel gap 22. A light-extraction structure 60 is formed in the edge gap 20 and at least partially exterior to the LED pixels 14, 14A. An optional cover 32 protects and encapsulates the pixels 14, 14A. A portion of the light emitted by the pixels 14, 14A is emitted from the device 10 and another portion of the light is trapped in the device 10 by total internal reflection. The device 10 can be employed as a display tile in a tiled array and is also referred to as such. The tiled array forms a large-format display or a large-format illumination device.

The formation of the light-extraction structure 60 within the edge gap 20 permits light that is trapped within the layers of the area-emissive light-emitting diode device 10 to be extracted from the area-emissive light-emitting diode device 10 and transmitted to a viewer. This extracted light reduces the contrast of the edge gap 20 when the area-emissive light-emitting diode device 10 is applied as a display tile 10 within a flat-panel display 8, particularly when the LED pixels 14, 14A of the display emit a high luminance. In an ideal embodiment, this light extraction structure 60 will be tuned to extract light that is generated by pixels 14A, very near the substrate edge 36 while extracting less light generated by pixels 14 that are very distant from the substrate edge 36. When this condition is met, the relative intensity and color of the light that is extracted by the light-extraction structure 60 will be highly correlated with the light that is produced by the pixels 14A that are near the substrate edge 36, insuring that the extracted light will reduce the contrast between the luminance of the edge gap 20 and the portion of the area-emissive light-emitting diode device 10 containing pixels 14. As this contrast is reduced, the visibility of the boundary between neighboring display tiles 10 is reduced and, when reduced sufficiently, the boundary between neighboring display tiles becomes indistinguishable.

Figure 13:
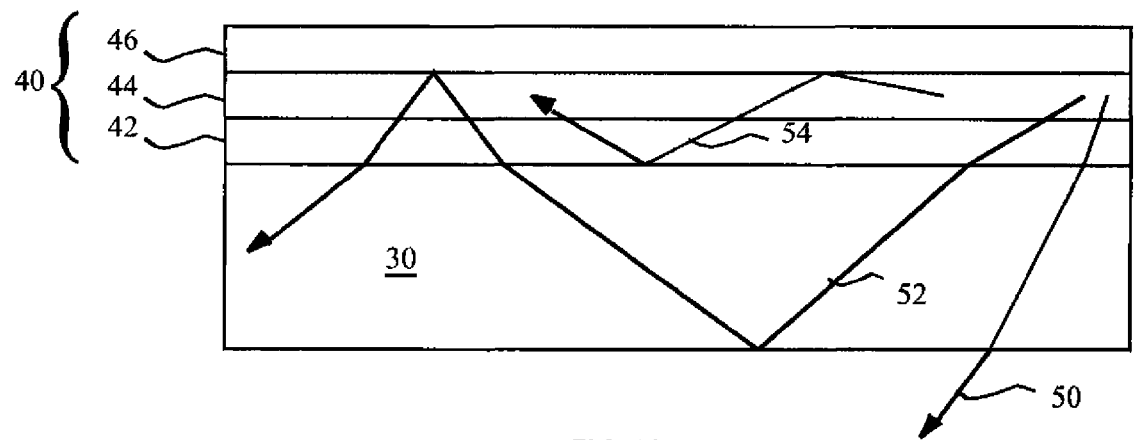
FIG. 13 is a prior-ant illustration of light-trapping in an emissive OLED device.

An area-emissive light-emitting diode pixel 14, 14A is a light-emitting diode formed from layers of organic or inorganic material, or both, coated over an area on a substrate, for example as illustrated in prior-art FIG. 13. When a current passes through the light-emitting diode, light is emitted over the extent of the coated area. In particular, area-emissive light-emitting diodes are not formed as point light-emitters in a solid-state, crystalline, semi-conductor substrate using doped inorganic materials embedded on or in the semi-conductor and the present invention does not include or apply to such point-source LEDs.

As shown in FIG. 13, the area-emissive light-emitting diode device 10 can include a substrate 30 on which is coated a first conductive material layer 42, which serves as an anode or a cathode. This layer can be deposited in a sheet or it can be patterned to form an array of electrodes. An electro-luminescent layer 44 is then deposited over the array of electrodes and will typically include at least one light-emitting layer and at least one hole-blocking layer or electron-blocking layer. It can additionally include hole-injection or electron-injection layers and hole-transport layers, electron-transport layers or other charge-control layers. Finally a second conductive layer 46 is deposited over the electro-luminescent layer 44. As was the case for the first conductive layer 42, the second electro-luminescent layer 44 can be patterned or applied as a sheet. However, at least one of the first conductive layer 42 or the second conductive layer 46 will typically be patterned to form an array of pixels 14, 14A. In a bottom-emitting area-emissive light-emitting diode device 10, the second conductive layer 46 can be reflective or it can be transparent or semitransparent. The first conductive layer 42 can be transparent or semitransparent. However, other configurations of transparent, reflective, or semi-transparent conductive material layers can be proposed as long as at least one of the conductive material layers is either transparent or semi-transparent. The substrate edge 36 can also include the edge of a cover 32 affixed to the substrate 30 to encapsulate and protect the pixels 14, 14A. While illustrated in FIG. 1 as a bottom-emitting device, the present invention can also apply to a top-emitting device, particularly if the gap between the substrate 30 and the cover 32 is filled with a material having an optical index similar to the cover 32 or substrate 30 (e.g. polymer) so that light is also trapped in the cover 32.

Figure 3:
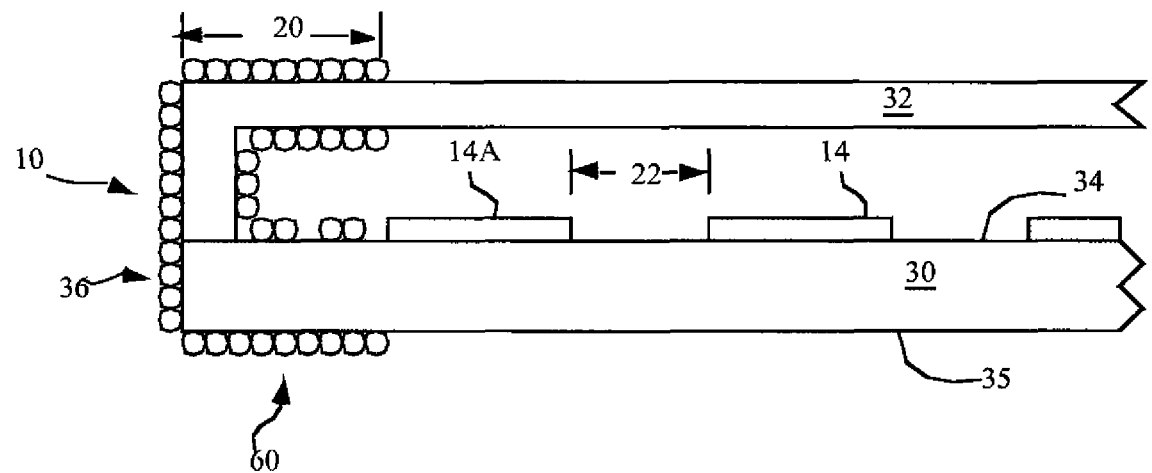
FIG. 3 is a cross-section of an LED device having a light-extracting structure formed on multiple surfaces in an edge gap according to another embodiment of the present invention.
Figure 7:
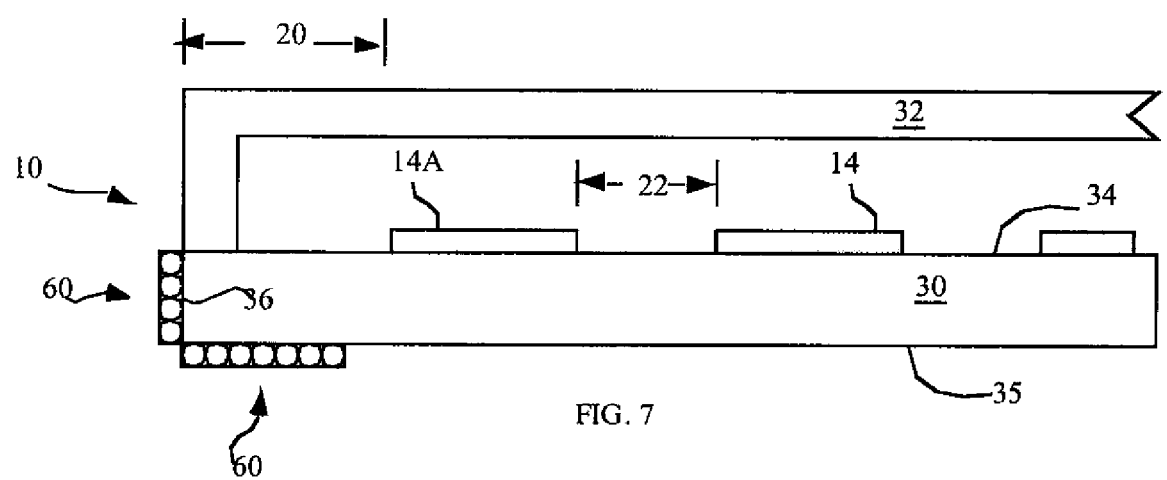
FIG. 7 is a cross-section of an LED device having edge-gap light-extraction film according to one embodiment of the present invention.
Figure 8:
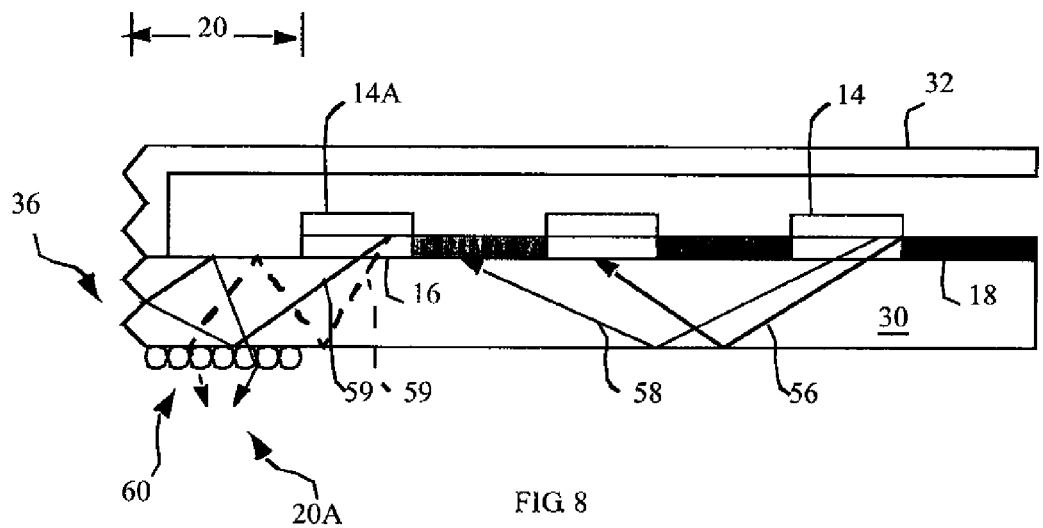
FIG. 8 is a cross-section of a bottom-emitter LED device according to an embodiment of the present invention illustrating the path of various light rays.
Figure 15:
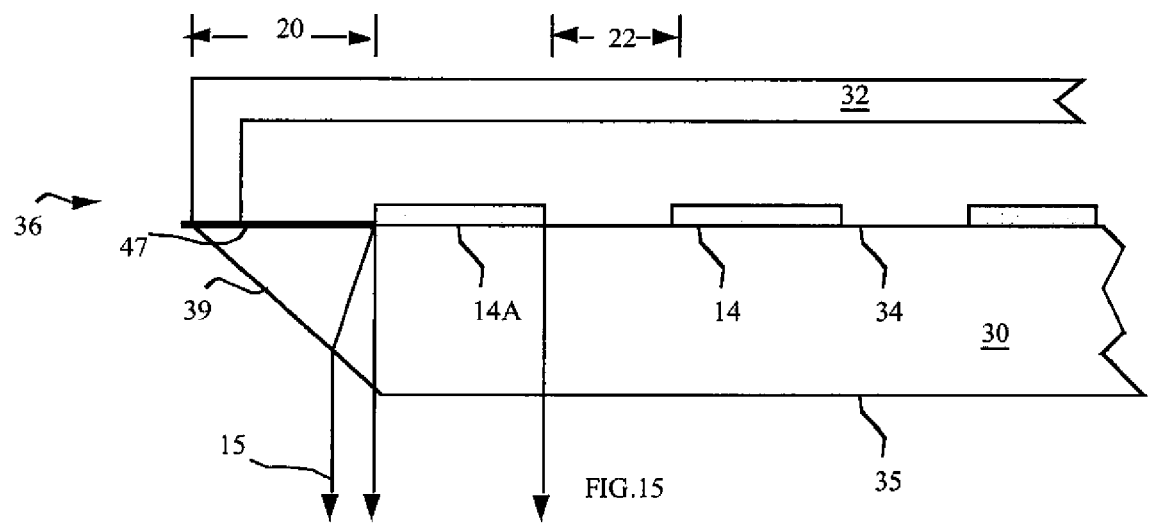
FIG. 15 is a cross-section of an example device for demonstrating an angled surface light-extraction structure according to an embodiment of the present invention.
Figure 23:
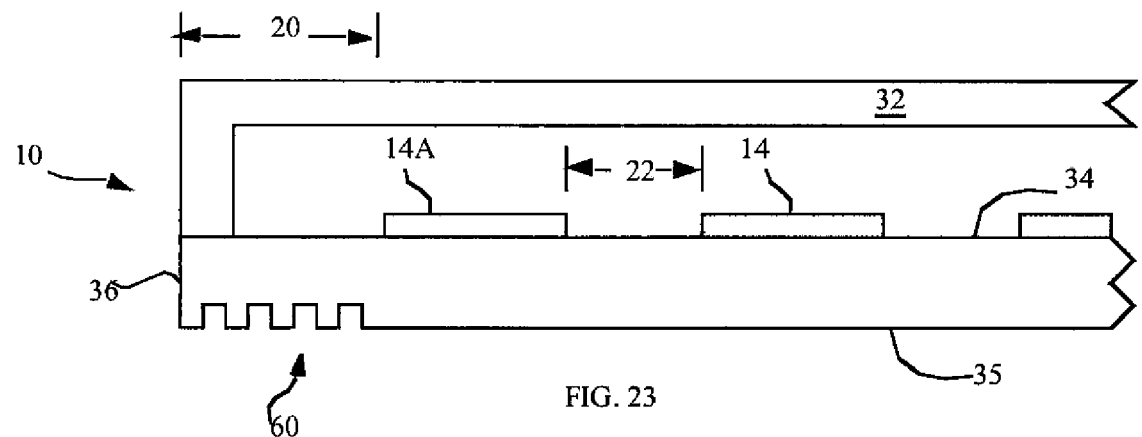
FIG. 23 is a cross-section of an LED device having edge-gap light-extraction according to one embodiment of the present invention.
Figure 24:
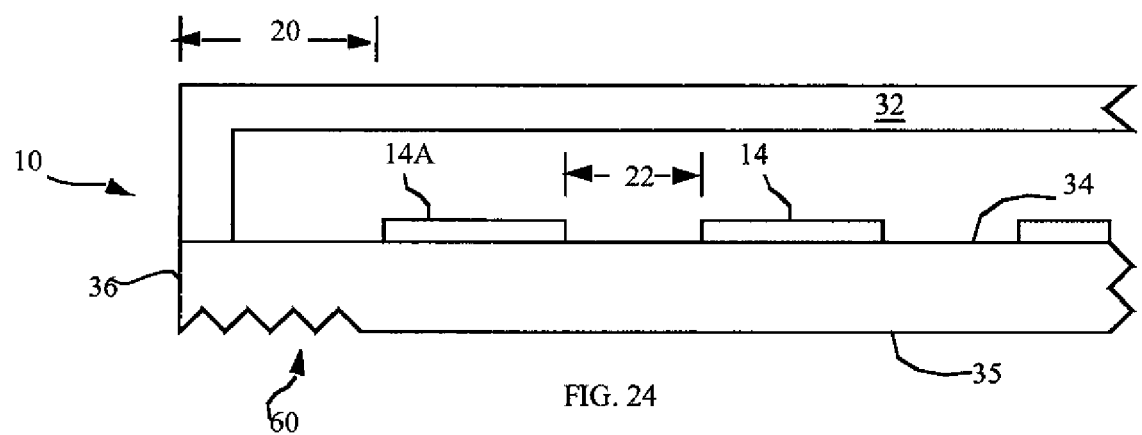
FIG. 24 is a cross-section of an LED device having edge-gap light-extraction according to another embodiment of the present invention.

Light extraction structures 60 are any structure that optically extracts light trapped through total internal reflection wave-guide mechanisms in the substrate or LED layers 40, or both, as illustrated in FIG. 13. Light-extraction structures 60 can include light-diffusive (light-scattering) surfaces (as shown in FIG. 1 as the light-extraction structure 60). Alternatively, light-scattering layers (e.g. comprising refractive particles such as titanium dioxide in a polymer binder as shown in FIG. 3 as the light-extraction structure 60), one or more lenslets (e.g. comprising a shaped structure as depicted in FIG. 8 as the light-extraction structure 60), a brightness enhancement filter (e.g. as commercially available and shown as element 60 in FIG. 24), a grating or other photonic crystal (e.g. a regular series of physical, topographical elements as shown as element 60 in FIG. 23), or an angled mirror or refractive element 39 (e.g. a surface 45-degrees to the substrate normal as shown in FIG. 15). The light-extraction structure 60 can be constructed in the substrate 30 or cover 32, or be applied to it as an additional layer or element, for example a film applied to a surface (e.g. a diffusive film as shown as element 60 in FIG. 7). Each of these structures is known in the optical art.

Figure 2:
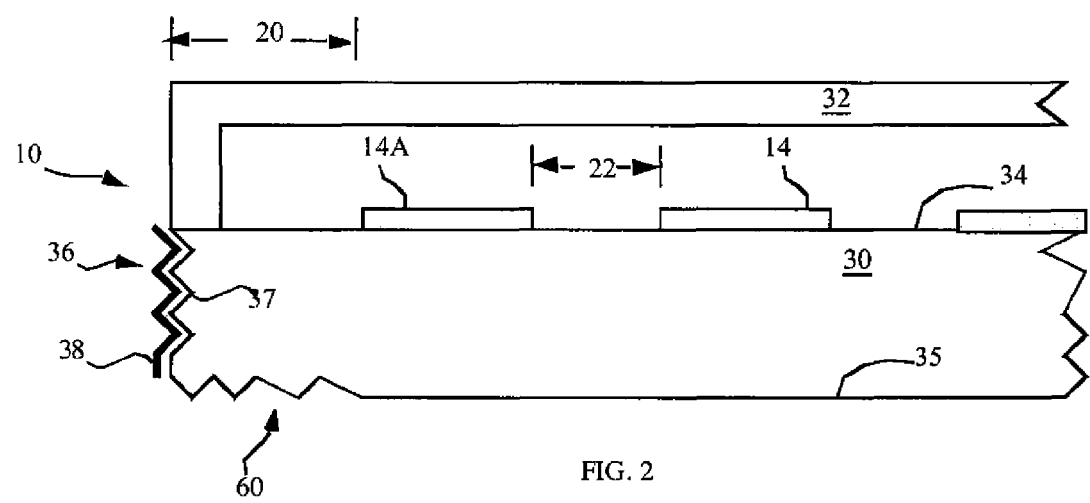
FIG. 2 is a cross-section of an LED device having a reflective, light-scattering edge surface according to an alternative embodiment of the present invention.

The light-extraction structure 60 is located in the edge gap 20 and can be located on any surface in the edge gap 20, e.g. on the substrate 30, cover 32, or edge 36 of either the cover 32 or substrate 30. The light-extraction structure 60 can be located on the substrate surface 34. Alternatively, the light-extraction structure 60 can be located on the opposing substrate surface 35, which is on the opposing surface of the substrate to the substrate surface 34. The array of LED pixels 14, 14A can be formed on the substrate surface 34 and the light-extraction structure 60 can be formed on the opposing substrate surface 35 (as shown in FIG. 1). In particular, the light-extraction structure 60 can be formed on or in multiple surfaces or on or in multiple locations, as shown in FIG. 2, where the light-extraction structure 60 is formed on both the opposing substrate surface 35 and the edge surface 37 of the substrate 30 as long as the structure extracts light within the edge gap 20. FIG. 3 illustrates a light-extraction structure comprising refractive particles adhered to both the cover 32 and substrate 30, both within the device and on the exterior surfaces, including the edge.

Figure 4:
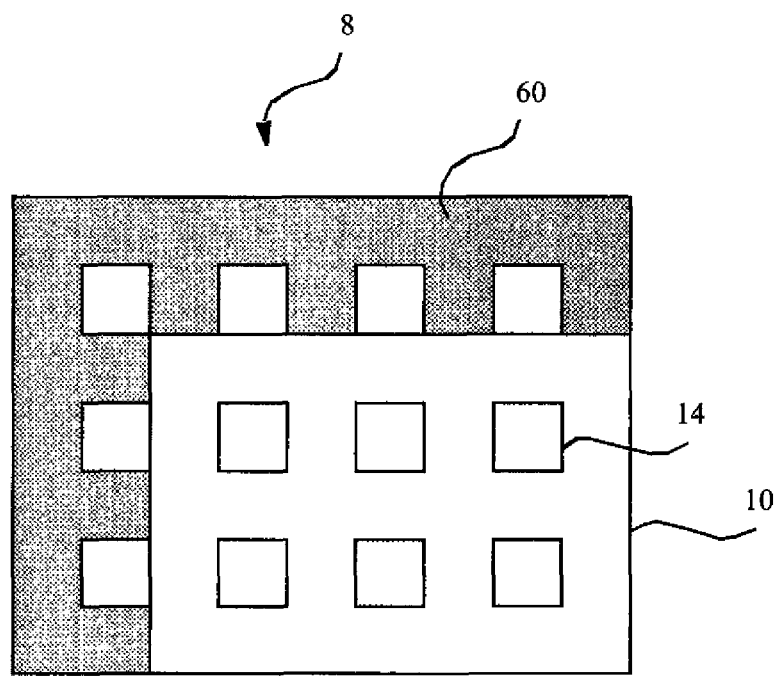
FIG. 4 is a top view of an LED device having a light-extraction structure between edge pixels according to yet another embodiment of the present invention.

In a further embodiment of the present invention, the light-extraction structure 60 can include reflective surfaces. Referring again to FIG. 2, the edge surface 37 can be coated with a reflective film 38, for example by evaporating a metal (such as silver or aluminum) over the edge surface 37 or by applying a film to the edge surface 37. A reflective surface can also be formed between the substrate 30 and the cover 32 to trap light within either the cover or the substrate within the region of the edge gap 20. In an alternative embodiment of the present invention as shown in top-view FIG. 4, the light-extraction structure 60 can extend beyond the edge gap 20 to include the area between the pixels 14 nearest the substrate edge 36 to increase the luminance output of the area-emissive LED device 10 in the area near the edge gap 20.

Figure 5:
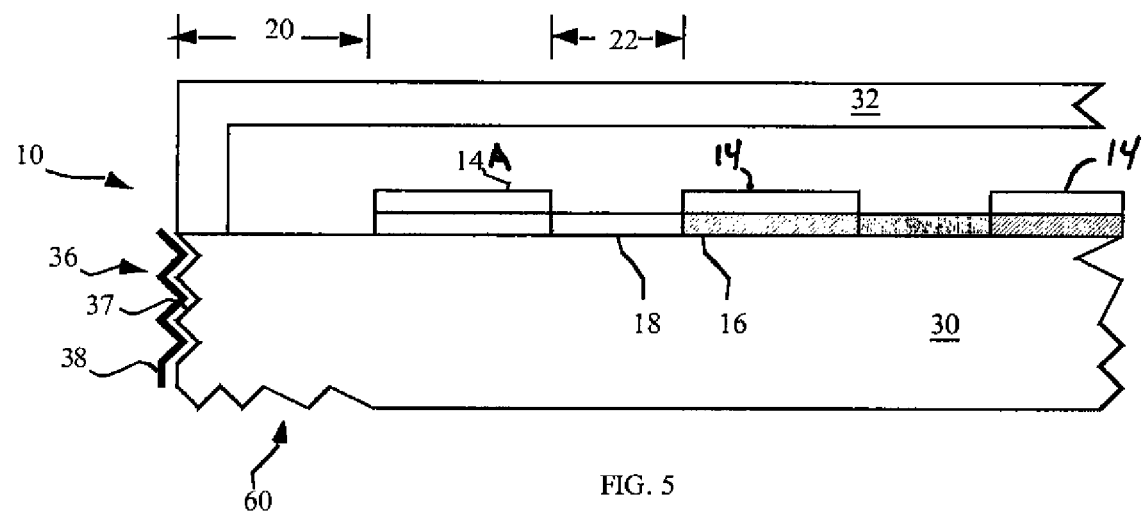
FIG. 5 is a cross-section of an LED device having color filters and a black matrix according to an embodiment of the present invention.
Figure 9:
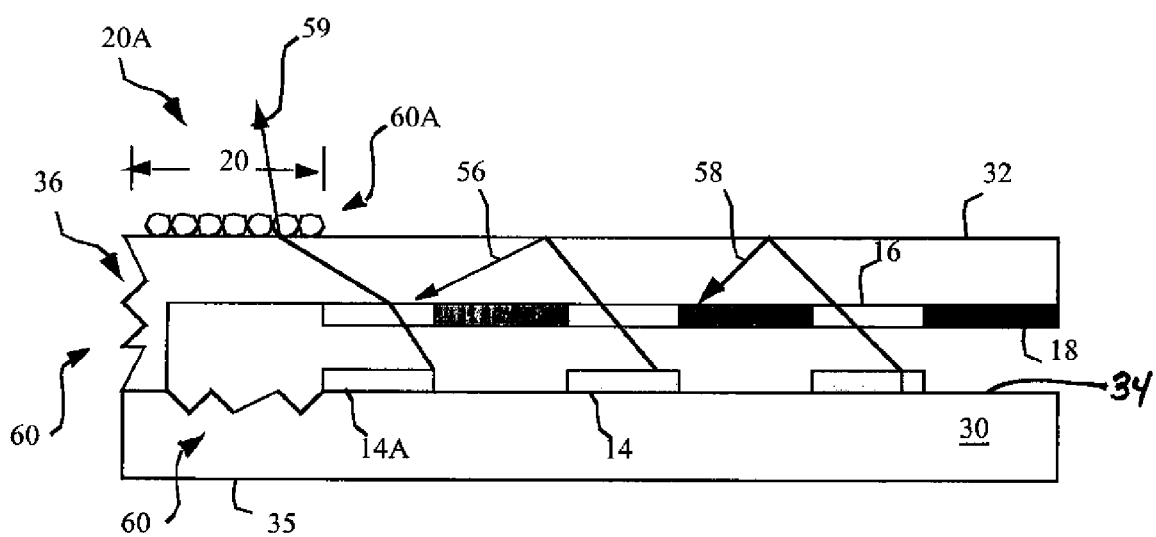
FIG. 9 is a cross-section of a top-emitter LED device according to an embodiment of the present invention illustrating the path of various light rays.
Figure 10:
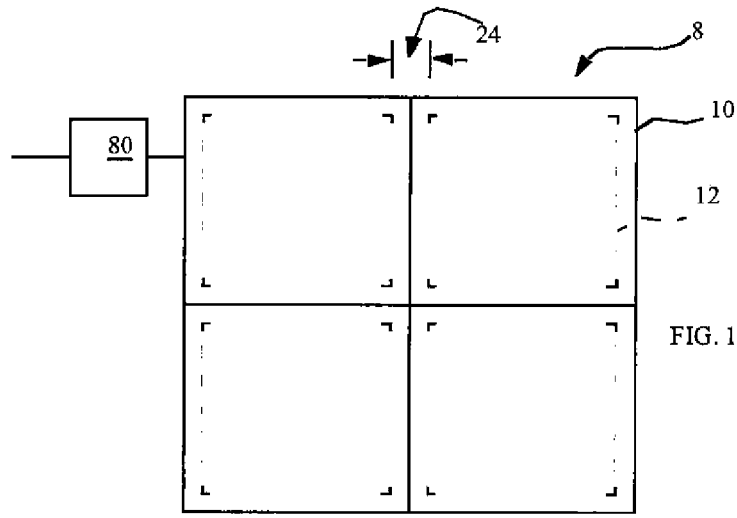
FIG. 10 is a top view of a prior-art tiled array of display devices.
Figure 11:
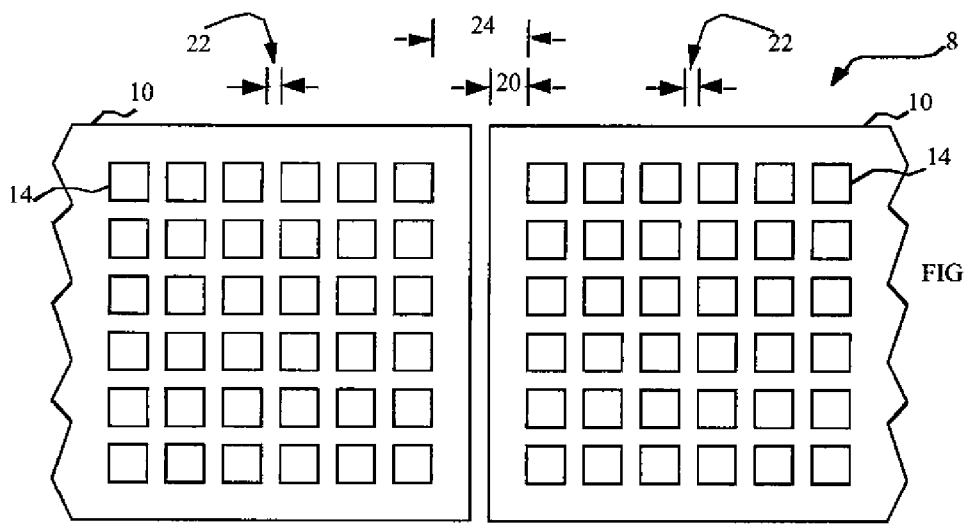
FIG. 11 is a more detailed top view of a prior-art tiled array of display devices.
Figure 12:
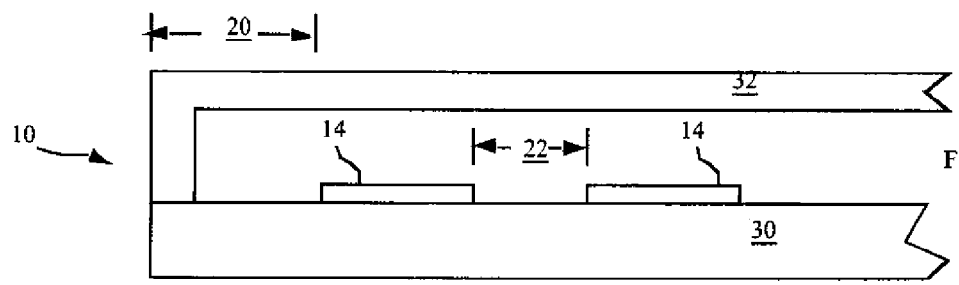
FIG. 12 is a cross-section of a prior-art device.

In yet another alternative embodiment depicted in FIG. 5 and FIG. 9, color filters 16 can be employed to filter the light emitted by the LEDs that form each pixel 14, 14A. This structure is particularly useful if the LEDs emit white light, for example as in an RGBW configuration known in the OLED art. As shown in FIG. 5, the color filters 16 can be located between the LEDs 14 and the substrate 30 in a bottom-emitter embodiment. In an alternative top-emitter embodiment, the color filters 16 can be located on the cover 32 as shown in FIG. 9. A black matrix 18 can be formed between the pixels 14 and exterior to at least a portion of the edge gap 20. In the present invention, color filters can have additional benefits beyond those taught in the prior art and these benefits are equally applicable whether the LEDs emit colored (e.g., red, green, or blue) or white light. Specifically, a significant proportion of the light that is trapped within the substrate, the conductive layers and the electro-luminescent layers will be reflected at material surfaces within the device and have the opportunity to travel through these color filters multiple times and pass through multiple colors of color filters when the light is generated by pixels 14 that are distant from the substrate edge 36. Since these color filters are absorptive, especially to light of particular wavelengths, much of the light that is generated by pixels that are sufficiently distant from the substrate edge will pass through multiple colors of color filters and much of this light will be absorbed by these color filters. However, light that is generated by pixels 14A very near the substrate edge 36 will not necessarily make multiple passes through the color filters 16. Also, light that is generated by the pixels 14A very near the substrate edge 36 will not pass through multiple colors of color filters. Therefore, a relatively small proportion of the light that is generated by the pixels 14A that are very near the edge of the substrate 36 will be absorbed by the color filters as compared to the light that is absorbed by the color filters for pixels 14 that are distant from the substrate edge 36. As such, the light extraction structure 60 in a device having color filters will be tuned to extract light that is generated by pixels very near the substrate edge 36 while extracting little or no light that is generated by pixels that are very distant from the substrate edge 36. Therefore, the relative intensity and color of the light that is extracted by the light-extraction structure 60 will be highly correlated with the light that is produced by the pixels 14 that are near the substrate edge 36 when color filters are applied.

This concept can be further illustrated by referring to FIG. 8, which includes an array of lenslets shown as the light extraction structure 60. As shown in FIG. 8, pixels 14 remote from the substrate edge 36 also emit light trapped in the substrate 30. In one embodiment of the present invention, the emitted light passes through a color filter 16. In a display device having a white-light emitter, different color filters are employed to provide different color pixels (e.g. red, green, blue). Hence, emitted light filtered through a blue filter can travel though the substrate 30 and be absorbed by a neighboring green color filter, for example as illustrated with light ray 56. Alternatively, emitted light can travel though the substrate 30 and be absorbed by the black matrix 18, for example as illustrated with light ray 58. In this way, light emitted by remote pixels can be absorbed within the device and not extracted in the edge gap 20, thereby preserving the sharpness of the display. It should be noted that while the color filters reduce the distance that trapped light can travel within the device, other layers within the device perform a similar function. For instance, it is common for one of the first or second conductive layers 42, 46 to be formed from a material such as A1, which has a reflectivity of less than 90%. Therefore, a significant portion of the photons that are formed within pixels that are distant from the substrate edge 36 are absorbed each time they encounter this conductive layer, which will also limit the distance that light can travel within the device. Note that only the light rays 59, which encounter the edge gap 20, and exit through the light-extraction layer 60 contribute to the light output within the region of the edge gap.

Figure 6:
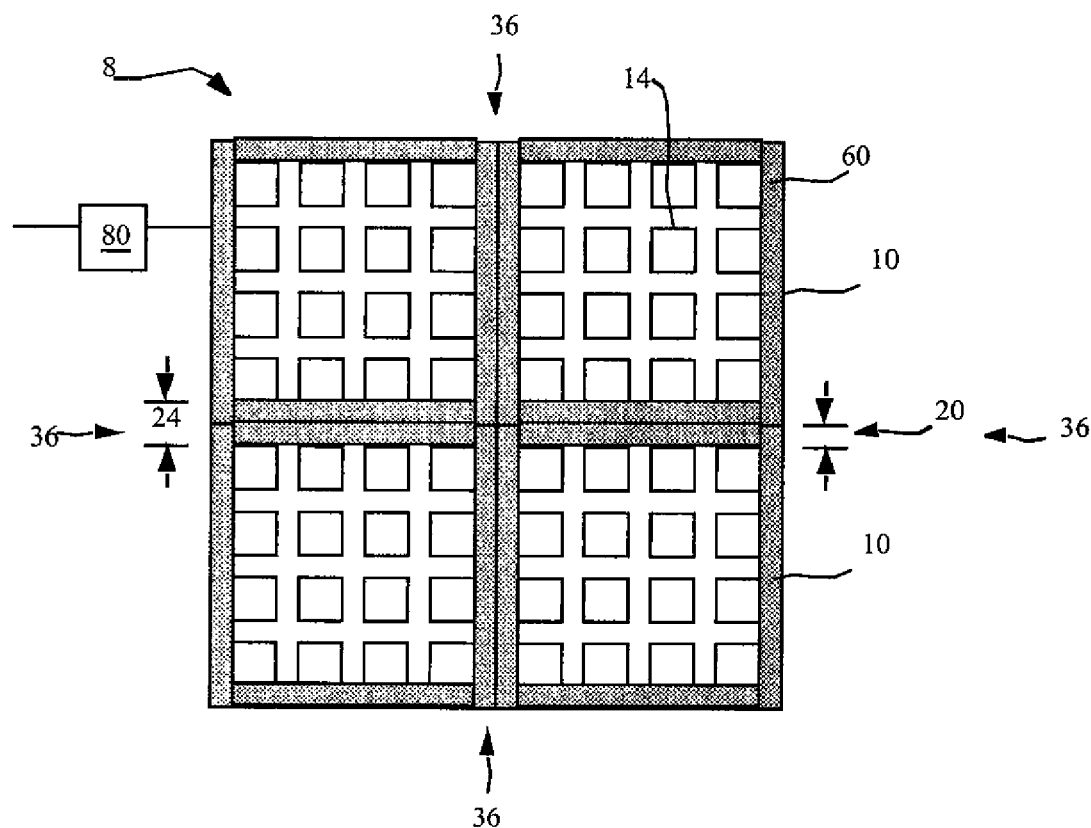
FIG. 6 is a top view of a tiled array of LED devices having edge-gap light-extraction according to another embodiment of the present invention.

In a further embodiment of the present invention illustrated in FIG. 6, the substrate 30 has a plurality of edges 36, each edge 36 corresponding to an edge 36 of the array of pixels 14 and forming an edge gap 20 for each edge 36, and a light-extraction structure 60 is formed in each edge gap 20 exterior to the LED pixels 14. This structure forms a tiled array 8 formed from a plurality of area-emissive LED devices 10. The substrate edges 36 of adjoining tiles abut.

In operation, the present invention is effective in reducing the visibility of the edge seams 24 in a tiled array of area-emissive LED devices 10 employing area-emissive light-emitting diodes to form pixels 14. Referring to FIG. 8, in a bottom-emitter configuration, area-emissive light-emitting diodes 14 emit light in response to current supplied through the LED electrodes (not shown in FIG. 8). The light can be emitted in any direction. Due to total internal reflection, a substantial portion of the emitted light is trapped in the high-optical index substrate 30. In particular, light emitted from pixel 14A can be trapped in the substrate 30 and travel into the edge gap 20. Once in the edge gap 20, the light can be extracted and emitted by the light-extraction structure 60, for example as illustrated with light rays 59. Locating a light-extraction structure on the edge as well as the substrate surface improves the efficiency of light extraction by extracting high-angle light that might not otherwise encounter the light-extraction structure. This emitted light then appears to form an extended light-emitting area for pixel 14A and thereby obscures the edge gap 20, improving the visual uniformity of the edge.

The light-extraction structure 60 can, optionally, extend into the pixel 14A area, but should not completely cover it, that is at least a portion of the pixel 14A is exterior to the light-extraction structure 60. If, for example, every pixel had light-extraction (as taught in the prior art), all of the pixels 14, 14A can have a greater luminance. However, simply making the device brighter does not effectively improve the visual uniformity of the edge. Alternatively, if pixel 14A were completely covered by a light-extraction structure but the other pixels 14 were not, pixel 14A would appear to have a greater luminance than the other pixels 14, so that the pixel luminance over the emissive area would not be uniform. Instead, according to an embodiment of the present invention, the light-extraction structure 60 extends into the edge gap 20 and, optionally, over only a portion of the pixel 14A so that the total luminance of the pixel 14A together with any light-emissive portion of the edge gap 20 has the same luminance as the other pixels 14. In effect, the trapped light in the edge gap 20 is used to apparently enlarge the pixel 14A into the edge gap 20. If the light-extraction structure increases the total light output by pixel 14A (or any pixel), the luminance of the pixel itself can be reduced to compensate, for example by employing a controller 80 (shown in FIG. 6) for driving at least one LED pixel on the substrate surface nearest the substrate edge with a reduced current compared to other LED pixels in the array.

Since a viewer cannot usually distinguish individual pixels, changing the apparent size of an individual pixel in a pixel array is not noticeable. In this way, visual brightness uniformity is maintained. As noted above, the light-extraction structure 60 will not extend into the area of the area-emissive LED device 10 beyond the pixel 14A nearest the edge gap 20. However, this does not preclude the application of a different light-extraction structure over the remainder of the area-emissive LED device 10. However, if a different light-extraction structure is applied over the remainder of the area-emissive LED device 10, it will be less efficient than the light-extraction structure 60 and will extract a smaller proportion of the light when the extracted light for an area that is equal distant from an illuminated area on the area-emissive LED device 10 as the edge gap 20.

The presence of a light extraction structure in the visible portion of the edge gap obscures the edge gap 20. In other portions of the edge gap 20 that are not directly visible, a light-extraction structure having a reflective element that directs the light into the viewing portion of the edge gap increases the amount of light emitted from the edge gap and helps to hide the edge seam. Hence, referring to FIG. 9 in a top-emitter embodiment of the present invention wherein the cover is transparent, the visible portion of the edge gap 20A has a light-extraction structure 60 on the cover in the edge gap 20, for example a light-diffusive coating. The light-extraction structure 60 on the edge 36 is preferably reflective, for example a diffusive surface with a reflective coating. This directs the light that encounters this edge back into the device providing an additional opportunity for the light-extraction structure 60 to extract this light within the edge gap 20. Such a layer has the additional benefit that it precludes light from the edge of the area-emissive LED device 10, where it can potentially be viewed when the display is viewed from a large viewing angle. The light-extraction structure on the substrate 30 preferably has a reflector on the substrate surface 34 or the opposing substrate side 35. This reflector can extend into the edge gap 20 to facilitate further light extraction in the edge gap 20.

The efficacy of providing light emission in the edge gap has been modeled and a light-extraction structure formed in an edge gap neighboring and at least partially exterior to, a pixel in an OLED device has been demonstrated. In a first set of experiments, displays were simulated having various sizes of edge gaps and various edge gap luminance values. These base experiments assumed that the luminance of the edge gap is influenced primarily by a few of the pixels neighboring the edge gap. Utilizing these experiments, it has been demonstrated that as the luminance within the edge gap is increased, the perceived width of the edge gap 20 and the contrast of the edge gap 20 with respect to typical image content is reduced when the area-emissive LED device 10 is applied within a tiled display device. Further, as the luminance of the area within the edge gap 20 approaches the average area luminance within the region of the area-emissive LED device 10 containing pixels 14, 14A, the edge gap 20 becomes invisible. However, as the luminance of the edge gap becomes higher than the average luminance of the region of the area-emissive LED device 10 containing pixels 14, 14A the edge gap 20 becomes visible as bright lines when the area-emissive LED device 10 is applied as a tile in a tiled display device. For devices having edge gaps as large as the width or height of four square pixels 14, 14A it has been observed that tiled displays having edge gaps 20 which emit between 50% and 120% of the average area luminance of the region of the area-emissive LED device 10 containing pixels 14, 14A the edge gap 20 can become invisible. For smaller edge gaps, the edge gap 20 can become invisible for even a wider range of luminance values. However, useful luminance values for the edge gap region can include values of between 5% and 150% of the average area luminance within the region of the area-emissive LED device 10 containing pixels 14, 14A.

Figure 14:
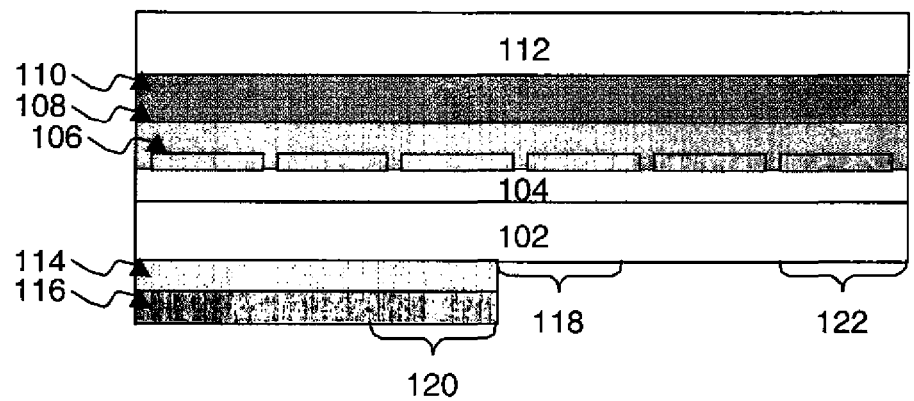
FIG. 14 is a cross-section of an example device for demonstrating a light-extraction structure according to an embodiment of the present invention.

To demonstrate light extraction from the edge gap 20 of area-emissive LED device 10, an experiment was performed using an active-matrix bottom emitting area-emissive LED device, some important elements of which are depicted in FIG. 14. This device was constructed on a glass substrate 102. Over this substrate 102 layers were deposited to form a typical amorphous silicon TFT drive layer 104 as is well known in the art. An array of transparent ITO anodes 106 was formed in electrical connection with the TFTs within the TFT drive layer 104. An EL layer 108 was formed over the ITO anodes 106 containing several light-emitting layers that emitted white light when electrically stimulated. An aluminum sheet cathode 110 was deposited to form a reflective rear electrode. Finally, the device was encapsulated by attaching a cover glass 112 over the entire device. To form the light-extraction structure 60 of the present invention, an index matching fluid 114, specifically Benzyl Alcohol was applied to a portion of the outside of the glass substrate 102 and a diffusing film 116 was applied over this same area of the display. This diffusing film was a commercially available LCD-backlight diffusing film.

To demonstrate light extraction only the pixels within region 118 were illuminated. Photometric measurements indicated that luminance produced within a 1.3 mm circular aperture of this area was 500 cd/m$^2$ Visual inspection demonstrated that light was emitted within the area 120 which represented the edge gap 20 within an area-emissive EL device of the present invention when only pixels within the region 118 were activated. Visual inspection also indicated that the luminance that was extracted by the light-extraction structure, specifically the diffusing film 116, was highest near the edge of the area 120 which was nearest the region 118 when pixels within region 118 were activated. Further, the luminance appeared to fall off rapidly as the distance from this edge was increased. Despite this nonuniformity, luminance was estimated using a photometer with a 1.3 mm circular aperture and was shown to be about 50 cd/m$^2$ or about 10% of the luminance produced within the region 118. The pixels within region 118 were then deactivated and pixels within region 122, the nearest edge of which was 4.5 mm away from the edge between region 118 and area 120 were activated to a luminance of 500 cd/m$^2$ Visual inspection indicated that some light was emitted in area 120 in response to activation of pixels within region 122. The luminance in area 120 was then measured using the same circular aperture and was found to provide about 5 cd/m$^2$ or about 0.1% of the luminance emitted by the pixels within region 122. As such, the application of the light-extraction layer, specifically the LCD diffusing film demonstrated extraction of trapped light within a region without light emission, which is representative of the edge gap region. The luminance from this light-extraction layer was shown to be larger when light was produced by pixels near the simulated edge gap and smaller when light was produced by pixels farther from the simulated edge gap.

Figure 16:
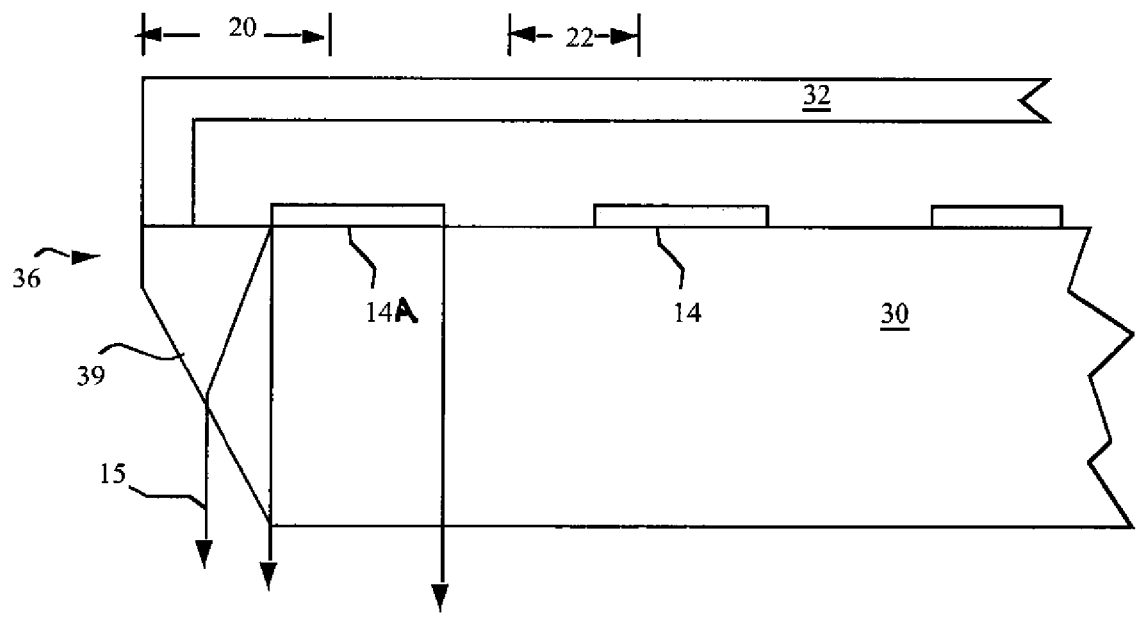
FIG. 16 is a cross-section of an example device for demonstrating a partially angled surface light-extraction structure according to an embodiment of the present invention.

Referring to FIG. 15, in one embodiment of the present invention, the substrate edge 36 is angled with a bevel to form an angled surface 39 having a surface at an angle other than 0 or 90 degrees with respect to either the internal or external substrate surfaces 34, 35. The angled surface 39 can comprise the entire substrate edge 36 (as shown in FIG. 15) or can comprise only a portion of the edge 36 by employing a partial bevel, as shown in FIG. 16, and in either case can provide an optical surface that images the edge pixel 14A into the edge gap 20. In either case, trapped light 15 emitted from pixel 14A (and possibly from other pixels 14 if their emitted light is not absorbed by other device structures such as a black matrix or color filters) is refracted by the angled surface 39 to a viewer, thereby extracting light from the edge 36 and increasing the luminance of the pixel 14A. The edge angle can be at a low angle with respect to the substrate 30 or at a high angle (e.g. 55-60 degrees). At higher angles the edge gap 20 becomes smaller so that manufacturing becomes more difficult but, according to optical modeling, the percentage of the edge seam 24 obscured by the extracted light 15 is greater, thus more effectively biding the edge seam 24. Alternatively, the substrate edge forming the light extraction structure can also be curved to form an optical surface that forms at least a portion of a refractive lens. The angled surface can be either rough, forming a partially diffusing element, or smooth to form an optical element which images the light-emitting elements 14A near the edge gap 20 into the edge gap 20. However, it is preferred that this edge be smooth, which can be obtained by several ways; including polishing or applying a polymer smoothing layer to fill in any surface regularities that might be caused by the process used to create the bevel. Many processes might be assumed to create this bevel; including grinding a flat substrate or forming the substrate with a beveled edge through casting or stamping.

Figure 17:
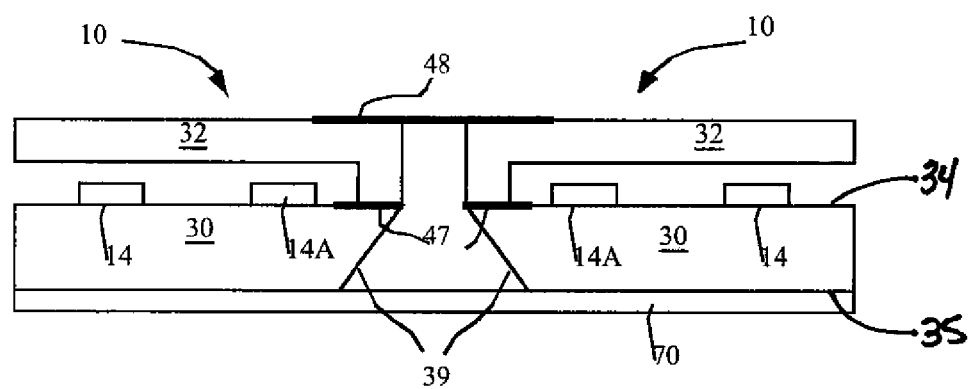
FIG. 17 is a cross-section of an example device for demonstrating two display devices having angled surface light-extraction structures according to an embodiment of the present invention of the present invention.

According to a further embodiment of the present invention and in reference to FIG. 15, a reflective surface 47 can be formed on the internal substrate surface 34 opposite to the portion of the external substrate surface 35 that is angled. A circular polarizer (as shown in FIG. 17) can be located on the external substrate surface 35 to absorb incident ambient light. This reflective layer 47 enhances the effectiveness of any circular polarizer employed on the external substrate surface 35 by reflecting ambient light. Referring to FIG. 17, in a tiled array of area-emissive light-emitting devices at least a portion of the substrate edge of each tile has an angled surface formed at an angle other than 90 degrees with respect to the internal or external substrate surfaces of the tile and the abutted substrate edges of the tiles have an angled surface formed at the same angle. A shown in FIG. 17, the angled surfaces 39 are the same on adjoining edges. The array of display tiles 10 is laminated to a circular polarizer 70 and reflective layers 47 (formed on the internal substrate surface 34) and 48 (formed on the external cover surface) reflect ambient light to enhance the ambient light absorption of the circular polarizer 70. For clarity, a gap is shown between the tile substrates 30; in practice this gap is made as small as possible or eliminated entirely.

Figure 18:
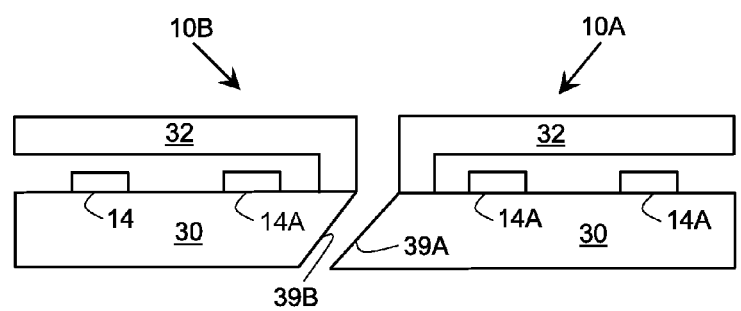
FIG. 18 is a cross-section of an example device for demonstrating two display devices having angled surface light-extraction structures according to an alternative embodiment of the present invention.

Referring to FIG. 18, in a further embodiment of the present invention, at least a portion of the substrate edge 39A, 39B of each tile has an angled surface formed at an angle other than 90 degrees with respect to the internal or external substrate surfaces of the tile and the abutted substrate edges of the tiles have parallel surfaces. Hence, adjoining substrate edges of tiles 10A, 10B can be angled to complement each other so that the angled surfaces are parallel and thereby obscure any structures in the edge gap.

To further reduce the visibility of the edge gap between pixels at the edge of tiles, an image signal can specify the desired luminance of each of the pixels in each device. The image signal can be adjusted so that the luminance of an LED nearest the edge of one device is controlled to be a combination of the desired luminance of the pixel nearest the edge of the one device combined with the desired luminance of a corresponding pixel nearest the edge of another neighboring device. For example, the edge pixels 14A on either side of an edge gap can be averaged to reduce the visibility of the edge gap.

Figure 19:
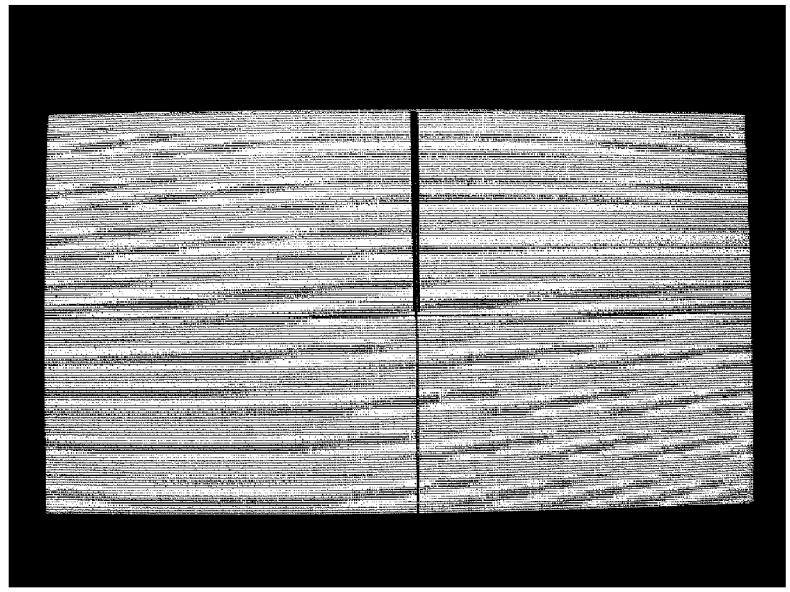
FIG. 19 is an image of an OLED display device without edge light extraction.
Figure 20:
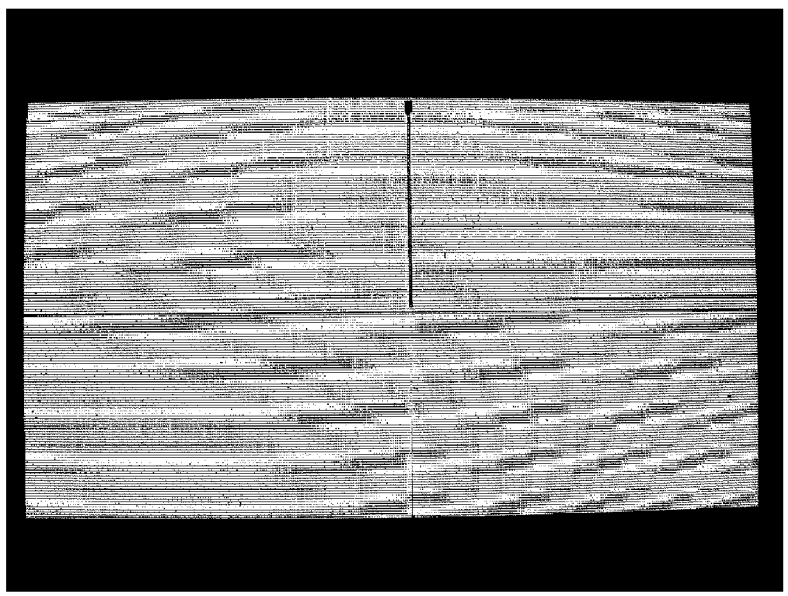
FIG. 20 is an image of an OLED display device with edge light extraction according to an alternative embodiment of the present invention.
Figure 21:
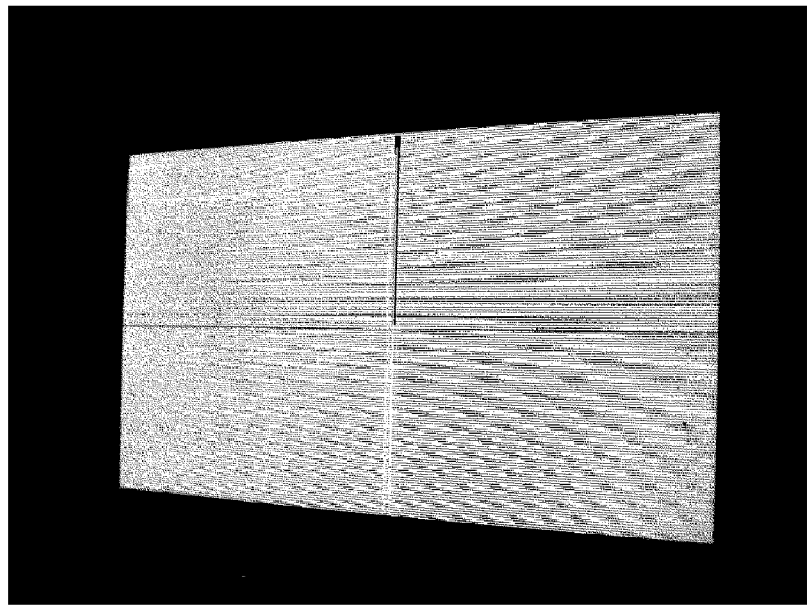
FIG. 21 is an image of an OLED display device with edge light extraction according to an alternative embodiment of the present invention.
Figure 22:
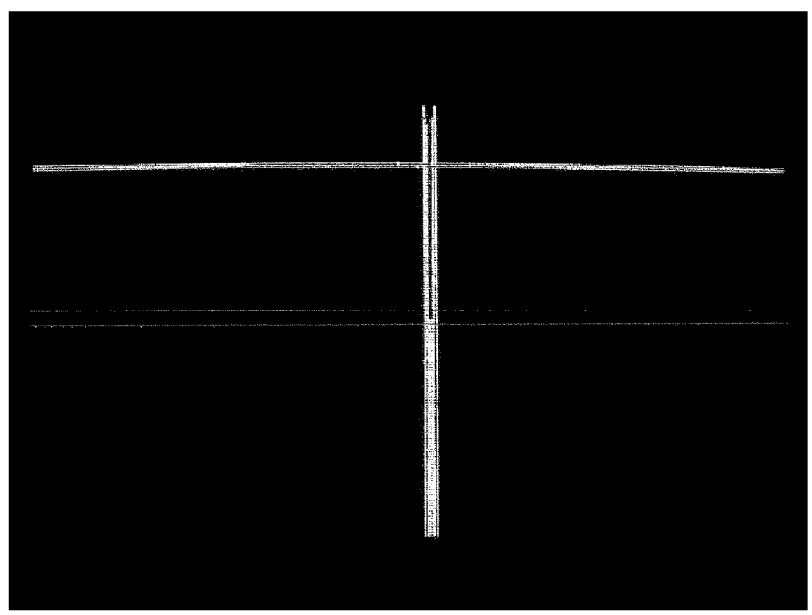
FIG. 22 is an image of an OLED display device with edge light extraction according to an alternative embodiment of the present invention.

The angled structures described in FIGS. 15-18 have been constructed. Referring to FIG. 19 a normal view of a monochrome OLED device depicts a wide vertical gap in the top half of the image and a narrow vertical gap in the bottom half of the image. The image of FIG. 19 is a control. In comparison, FIG. 20 is a normally viewed image of the device of FIG. 19 having an angled surface of 60 degrees into which trapped light is emitted. Similarly, FIG. 21 is an image viewed at 45 degrees of the device of FIG. 19 having an angled surface of 60 degrees into which trapped light is emitted. As can be seen from both FIGS. 20 and 21, the apparent, visible width of the edge seam is reduced. Referring to FIG. 22, the edge seam is likewise occluded when only the pixels adjacent to the vertical seam are active. Indeed, in the bottom half of the FIG. 22 image, the narrower edge seam is completely obscured. In the top half, the wider edge seam is apparently about one third the actual edge seam width.

An area-emissive light-emitting diode (LED) device according to the present invention can be constructed by providing a substrate having a substrate surface and a substrate edge, forming an array of area-emissive LED pixels on the substrate surface with an edge gap between the substrate edge and the LED pixel on the substrate surface nearest the substrate edge, and forming a light-extraction structure in the edge gap exterior to the LED pixels. The light-extraction structure can be formed by mechanical processes, chemical processes, or the application of a film to the substrate surface, an opposing substrate surface opposite the substrate surface, or the substrate edge. Alternatively, a light-extraction structure can be formed on any or the entire substrate surface, an opposing substrate surface opposite the substrate surface, or the substrate edge of either a substrate or a cover provided to protect and encapsulate the area-emissive light-emitting diodes. The light-extraction structure can be formed by etching or abrading the substrate surface or substrate edge, for example by applying hydrofluoric acid, rapid temperature cycling using lasers, or, sandblasting. At least a portion of the light-extraction structure can be formed by etching at least a portion of the substrate edge and depositing a reflective film over the portion of the substrate edge, for example by evaporating a metal over the etched substrate edge- Edges can also be ground to form angled structures.

LED devices of this invention can employ various well-known optical effects in order to enhance their properties if desired. This includes optimizing layer thicknesses to increase light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

The present invention can be practiced with either active- or passive-matrix OLED devices. It can also be employed in display devices or in area illumination devices. In a preferred embodiment, the present invention is employed in a flat-panel OLED device composed of small molecule or polymeric OLEDs as disclosed in but not limited to U.S. Pat. No. 4,769, 292, issued Sep. 6, 1988 to Tang et al., and U.S. Pat. No. 5,061,569, issued Oct. 29, 1991 to Van Slyke et al. Many combinations and variations of organic light-emitting displays can be used to fabricate such a device, including both active- and passive-matrix OLED displays having either a top- or bottom-emitter architecture. Alternatively, inorganic materials, for example phosphorescent particles in a polycrystalline semi-conductor matrix can be employed. Other organic or inorganic layers can be employed to control charge injection, transport, or blocking for either organic or inorganic light-emitting layers.

The invention has been described in detail with particular reference to certain preferred embodiments thereof, but it will be understood that variations and modifications can be effected within the spirit and scope of the invention.

PARTS LIST 8 display tile array
10, 10A, 10B display tile
12 active (display) area
14 pixel
14A edge pixel
15 emitted light
16 color filter
18 black matrix
20 edge gap
20A visible portion of edge gap
22 inter-pixel gap
24 edge seam
30 substrate
32 cover
34 internal substrate surface
35 external substrate surface
36 edge
37 edge surface
38 reflective film
39, 39A, 39B angled surface
40 OLED
42 transparent electrode
44 organic layer(s)
46 reflective electrode
47 reflective layer
48 reflective layer
50, 52, 54 light rays
56, 58, 59 light rays
60 light-extraction structure
70 circular polarizer 80 controller
102 glass substrate
104 drive layer
106 anodes
108 EL layer
110 cathode
112 cover glass
114 index matching fluid
116 diffusing film
118 region
120 area
122 region

The invention claimed is:

1. An area-emissive light-emitting diode (LED) device, comprising:
   a) a substrate having an internal substrate surface, an external substrate surface opposite the internal substrate surface, and a substrate edge;
   b) an array of area-emissive LED pixels formed on the internal substrate surface with an edge gap between the substrate edge and the LED pixel on the internal substrate surface nearest the substrate edge;
   c) an array of color filters formed in a layer between each of the area-emissive LED pixels and the internal substrate surface or in a layer on a side of at each of the LED pixels opposite the internal substrate surface;
   d) a black matrix formed in a layer between the area-emissive LED pixels;
   e) a light-extraction structure formed in the edge gap and at least partially exterior to the LED pixels; and
   f) another array of area-emissive LED pixels having another edge gap that is adjoined to the edge gap of the array of area-emissive LED pixels,
   wherein the edge gaps emit between 5% to 150% of an average area luminance of the arrays of area-emissive LED pixels.

2. The area-emissive light-emitting diode device of claim 1, wherein a reflective surface is formed in combination with the light-extraction structure.

3. The area-emissive light-emitting diode device of claim 1, wherein the light-extraction structure is located on or in the external substrate surface, on or in the internal substrate surface, or on or in the substrate edge.

4. The area-emissive light-emitting diode device of claim 1, wherein the pixels emit light through the substrate and further comprising a circular polarizer adhered to the external substrate surface.

5. The area-emissive light-emitting diode device of claim 1, wherein the light-extraction structure is further formed between pixels nearest the substrate edge.

6. The area-emissive light-emitting diode device of claim 1, wherein the edge gap is larger than the distance between neighboring pixels.

7. The area-emissive light-emitting diode device of claim 1, further comprising a controller for driving at least one LED pixel nearest the substrate edge with a reduced current compared to other LED pixels in the array.

8. The area-emissive light-emitting diode device of claim 1, wherein at least a portion of the substrate edge is an angled surface formed at an angle other than 90 degrees with respect to the internal or the external substrate surfaces.

9. The area-emissive light-emitting diode device of claim 8, wherein the angled surface is beveled, or partially beveled, to form a flat surface having an angle between 0 and 90 degrees with respect to either the internal or the external substrate surfaces.

10. The area-emissive light-emitting diode device of claim 8, wherein the angled surface has an angle between 55 and 65 degrees.

11. The area-emissive light-emitting diode device of claim 8, wherein the angled surface is an optical surface, so that at least some of the LED pixels are imaged in the area of the edge gap.

12. The area-emissive light-emitting diode device of claim 8, wherein the angled surface is curved.

13. The area-emissive light-emitting diode device of claim 1, further comprising:
   a cover having an internal cover surface adhered to the internal substrate surface, an external cover surface opposite the internal cover surface, and having a cover edge and wherein the light-extraction structure is located on the internal cover surface, the external cover surface, or cover edge.

14. The area-emissive light-emitting diode device of claim 13, wherein the cover is transparent and the pixels emit light through the cover and further comprising a circular polarizer adhered to the external cover surface.

15. An area-emissive light-emitting device having tiles formed from a plurality of area-emissive light-emitting diodes of claim 1 and wherein substrate edges of adjoining tiles abut.

16. The area-emissive light-emitting device of claim 15, wherein at least a portion of the substrate edge of each tile has an angled surface formed at an angle other than 90 degrees with respect to the internal or the external substrate surfaces of the tile and the abutted substrate edges of the tiles have parallel surfaces.

17. The area-emissive light-emitting device of claim 15, wherein at least a portion of the substrate edge of each tile has an angled surface formed at an angle other than 90 degrees with respect to the internal or the external substrate surfaces of the tile and the abutted substrate edges of the tiles have an angled surface formed at the same angle.

18. The area-emissive light-emitting diode device of claim 1, wherein the light-extraction structure is a diffuser, a scattering layer, one or more lenslets, a brightness enhancement filter, a grating, a reflective or refractive element, or a photonic crystal.

19. The area-emissive light-emitting diode device of claim 1, wherein the edge gaps emit between 50% to 120% of an average area luminance of the arrays of area-emissive LED pixels.

* * * * *